United States Patent
Bethoux et al.

(10) Patent No.: US 8,759,881 B2
(45) Date of Patent: Jun. 24, 2014

(54) HETEROSTRUCTURE FOR ELECTRONIC POWER COMPONENTS, OPTOELECTRONIC OR PHOTOVOLTAIC COMPONENTS

(75) Inventors: Jean-Marc Bethoux, Grenoble (FR); Fabrice Letertre, Grenoble (FR); Chris Werkhoven, Gilbert, AZ (US); Ionut Radu, Crolles (FR); Oleg Kononchuck, Theys (FR)

(73) Assignee: Soitec, Bernin (FR)

( * ) Notice: Subject to any disclaimer, the term of this patent is extended or adjusted under 35 U.S.C. 154(b) by 47 days.

(21) Appl. No.: 13/513,151

(22) PCT Filed: Dec. 1, 2010

(86) PCT No.: PCT/EP2010/068614
§ 371 (c)(1),
(2), (4) Date: Jun. 12, 2012

(87) PCT Pub. No.: WO2011/067276
PCT Pub. Date: Jun. 9, 2011

(65) Prior Publication Data
US 2012/0241821 A1    Sep. 27, 2012

Related U.S. Application Data

(63) Continuation of application No. 12/956,675, filed on Nov. 30, 2010, now abandoned.

(30) Foreign Application Priority Data

Dec. 1, 2009    (FR) .................................... 09 58547

(51) Int. Cl.
*H01L 31/06*    (2012.01)

(52) U.S. Cl.
USPC ................. 257/201; 257/98; 257/99; 438/22; 438/47; 438/51; 438/455

(58) Field of Classification Search
CPC ..................... H01L 21/02458; H01L 21/0254; H01L 33/007; H01L 21/02389; H01L 21/02381; H01L 21/2007; H01L 29/2003; H01L 29/66462; H01L 33/382

USPC ........... 257/200–201, 98–99; 438/22, 47, 51, 438/455
See application file for complete search history.

(56) References Cited

U.S. PATENT DOCUMENTS

| | | | | |
|---|---|---|---|---|
| 5,236,118 A | | 8/1993 | Bower et al. | 228/193 |
| 5,319,223 A | * | 6/1994 | Fujita et al. | 257/190 |

(Continued)

FOREIGN PATENT DOCUMENTS

| | | |
|---|---|---|
| EP | 0 533 551 A1 | 3/1993 |
| WO | WO 01/95380 A1 | 12/2001 |

OTHER PUBLICATIONS

Internation Search Report, PCT/EP2010/068614, mailed Mar. 11, 2011.

(Continued)

*Primary Examiner* — Fernando L Toledo
*Assistant Examiner* — Mohammed Shamsuzzaman
(74) *Attorney, Agent, or Firm* — TraskBritt

(57) ABSTRACT

A heterostructure that includes, successively, a support substrate of a material having an electrical resistivity of less than $10^{-3}$ ohm·cm and a thermal conductivity of greater than 100 W·m$^{-1}$·K$^{-1}$, a bonding layer, a first seed layer of a monocrystalline material of composition $Al_xIn_yGa_{(1-x-y)}N$, a second seed layer of a monocrystalline material of composition $Al_xIn_yGa_{(1-x-y)}N$, and an active layer of a monocrystalline material of composition $Al_xIn_yGa_{(1-x-y)}N$, and being present in a thickness of between 3 and 100 micrometers. The materials of the support substrate, the bonding layer and the first seed layer are refractory at a temperature of greater than 750° C., the active layer and second seed layer have a difference in lattice parameter of less than 0.005 Å, the active layer is crack-free, and the heterostructure has a specific contact resistance between the bonding layer and the first seed layer that is less than or equal to 0.1 ohm·cm$^2$.

19 Claims, 3 Drawing Sheets

(56) References Cited

U.S. PATENT DOCUMENTS

| | | | |
|---|---|---|---|
| 5,321,712 A * | 6/1994 | Itaya et al. | 372/43.01 |
| 5,439,843 A * | 8/1995 | Sakaguchi et al. | 438/459 |
| 5,646,067 A | 7/1997 | Gaul | 437/180 |
| 6,121,112 A * | 9/2000 | Sakaguchi et al. | 438/406 |
| 6,177,359 B1 * | 1/2001 | Chen et al. | 438/751 |
| 6,232,138 B1 * | 5/2001 | Fitzgerald et al. | 438/46 |
| 6,274,399 B1 * | 8/2001 | Kern et al. | 438/22 |
| 6,359,919 B1 * | 3/2002 | Ishikawa et al. | 372/45.01 |
| 6,455,340 B1 * | 9/2002 | Chua et al. | 438/31 |
| 6,525,335 B1 * | 2/2003 | Krames et al. | 257/13 |
| 6,757,314 B2 * | 6/2004 | Kneissl et al. | 372/50.1 |
| 7,244,630 B2 * | 7/2007 | Krames et al. | 438/47 |
| 7,501,023 B2 * | 3/2009 | Dmitriev et al. | 117/99 |
| 7,732,301 B1 * | 6/2010 | Pinnington et al. | 438/455 |
| 8,471,239 B2 * | 6/2013 | Song | 257/13 |
| 2003/0064535 A1 | 4/2003 | Kub et al. | 438/22 |
| 2003/0089921 A1 * | 5/2003 | Jordan et al. | 257/200 |
| 2003/0136333 A1 | 7/2003 | Semond et al. | 117/95 |
| 2005/0020032 A1 * | 1/2005 | Solanki et al. | 438/458 |
| 2005/0026392 A1 * | 2/2005 | Jurgensen et al. | 438/455 |
| 2005/0110037 A1 * | 5/2005 | Takeda et al. | 257/103 |
| 2006/0060922 A1 * | 3/2006 | Letertre et al. | 257/347 |
| 2006/0220031 A1 * | 10/2006 | Krames et al. | 257/79 |
| 2006/0255341 A1 * | 11/2006 | Pinnington et al. | 257/79 |
| 2007/0099321 A1 * | 5/2007 | Miyachi et al. | 438/28 |
| 2008/0169483 A1 | 7/2008 | Kasai et al. | 257/183 |
| 2008/0237622 A1 * | 10/2008 | Choi et al. | 257/98 |
| 2008/0261344 A1 * | 10/2008 | Jafri et al. | 438/51 |
| 2008/0298411 A1 * | 12/2008 | Hata | 372/45.01 |
| 2009/0052489 A1 * | 2/2009 | Nomura | 372/49.01 |
| 2009/0218589 A1 * | 9/2009 | Zimmerman et al. | 257/99 |
| 2009/0278233 A1 * | 11/2009 | Pinnington et al. | 257/615 |
| 2010/0051967 A1 * | 3/2010 | Bradley et al. | 257/80 |
| 2010/0142576 A1 * | 6/2010 | Cohen et al. | 372/45.01 |
| 2010/0290498 A1 * | 11/2010 | Hata et al. | 372/50.12 |
| 2011/0051771 A1 * | 3/2011 | Avramescu et al. | 372/50.1 |
| 2011/0117726 A1 * | 5/2011 | Pinnington et al. | 438/458 |
| 2011/0260192 A1 * | 10/2011 | Kwak et al. | 257/98 |
| 2012/0018764 A1 * | 1/2012 | Choi et al. | 257/99 |
| 2012/0286239 A1 * | 11/2012 | Won et al. | 257/13 |
| 2012/0322191 A1 * | 12/2012 | Lee et al. | 438/47 |

OTHER PUBLICATIONS

French Search Report, FR 0958547, mailed Jun. 22, 2010.

Lin, M.E. et al., XP-002051658, "Low Resistance Ohmic Contacts on Wide Band-Gap GaN", Applied Phys. Lett., vol. 64, No. 8, pp. 1003-1005 (1994).

Otake, Hirotaka et al., XP-002587692, "GaN-Based Trench Gate Metal Oxide Semiconductor Field Effect Transistors with Over 100cm$^2$/(Vs) Channel Mobility", Japanese Journal of Applied Physics, vol. 46, No. 25, pp. L599-L601, (2007).

Zeng, S.W. et al., XP-002587693, "Substantial Photo-Response of InGaN p-i-n Homojunction Solar Cells", Semiconductor Science and Technology, vol. 24, pp. 1-4 (2009).

* cited by examiner

HETEROSTRUCTURE FOR ELECTRONIC POWER COMPONENTS, OPTOELECTRONIC OR PHOTOVOLTAIC COMPONENTS

This application is a 371 filing of International Patent Application PCT/EP2010/068614 filed Dec. 1, 2010 and a continuation of application Ser. No. 12/956,675 filed Nov. 30, 2010.

FIELD OF THE INVENTION

The present invention relates to a heterostructure for the manufacture of electronic power components or optoelectronic components, or photovoltaic components successively comprising from its base to its surface:
- a support substrate,
- a bonding layer,
- a crack-free monocrystalline layer, so-called "active layer," of a material of composition $Al_xIn_yGa_{(1-x-y)}N$, where $0 \leq x \leq 1$, $0 \leq y \leq 1$ and $x+y \leq 1$, presenting a thickness of between 3 and 100 micrometers, in which or on which the components are manufactured.

BACKGROUND OF THE INVENTION

For the vertical or planar electronic power device (MOS components, bipolar transistors, J-FET, MISFET, Schottky or PIN diodes, thyristors), optoelectronic component (Laser, LED) and photovoltaic component (solar cells) market, it is interesting to utilize an $Al_xIn_yGa_{(1-x-y)}N$ (x between or equal to 0 and 1, y between or equal to 0 and 1, x+y less than or equal to 1) conducting substrate and preferably a bulk GaN (or "freestanding") substrate.

These substrates are, however, difficult to manufacture with current technologies and remain very expensive.

A proposed alternative consists of a heterostructure comprising a thick active layer of $Al_xIn_yGa_{(1-x-y)}N$ (preferably in doped GaN) formed on a conductive substrate.

But the growth of thick layers with a good crystalline quality is still difficult with current methods if the seed substrate is not of the same material as the material epitaxied.

The epitaxy of a thick layer of GaN (approximately 10 micrometers) on a seed substrate such as doped Si or SiC, due to the differences in the coefficient of thermal expansion (CTE) and lattice parameter between the materials, leads to the formation of defects and cracks in the layer which reduces the effectiveness of the electronic, optical or optoelectronic devices formed on this material.

In addition, as document WO 01/95380 discloses, this epitaxy necessitates the utilization of a buffer layer—for example a layer of AlN—between the seed substrate and the GaN that presents high electric resistance.

The epitaxy of a thick layer of GaN on a sapphire substrate followed by the transfer of the layer to a conductive substrate by laser detachment is an expensive process.

In addition, the choice of these materials does not allow a dislocation density of less than $10^7$ cm$^{-2}$ to be reached in the active layer.

In addition, the layer thus formed presents very significant bending which necessitates long preparation steps (polishing, etc.) so that it may be bonded and transferred to a final substrate.

In addition, the transfer of a layer of GaN from a bulk substrate by the SMARTCUT® technology does not enable the desired thicknesses to be reached in a satisfactory manner to date.

Document US 2008/0169483 describes the formation of an epitaxy substrate comprising a seed layer of GaN transferred by the SMARTCUT® technology to a support substrate.

A layer of conductive GaN is then deposited on the seed layer and then it is transferred to a thermally and electrically conductive support.

This method is complex since it involves two transfers of the active layer of GaN to form the final conductive structure.

Document US 2009/278233 describes the formation of a heterostructure for light-emitting devices.

The manufacturing of the heterostructure comprises first a step of providing on a handle substrate a seed layer suited for the epitaxial growth of an active layer made of a III/N material and a step of growing the active layer on the seed layer, thus producing an intermediate structure.

This intermediate structure is then bonded to a final substrate, preferably via a eutectic bonding layer, and the handle substrate is removed.

This method is thus complex since it involves the use of two different support substrates, the first one for the epitaxial growth of the active layer, the second one for the operation of the component.

Therefore one seeks to design a heterostructure for electronic power components, optoelectronic components or photovoltaic components and a method of manufacturing the heterostructure in view of obtaining a thick, crack-free monocrystalline layer of a material of composition $Al_xIn_yGa_{(1-x-y)}N$ on a support substrate, not presenting the disadvantages of methods from the prior art. In particular, a simplification of the process steps is sought.

More precisely, the heterostructure must present the following properties:
- a thick active layer, i.e., with a thickness greater than or equal to 3 micrometers, preferably greater than 10 micrometers,
- a good vertical electrical conductivity despite interfaces between different materials forming the heterostructure, i.e., a total electrical resistivity of less than or equal to $10^{-2}$ ohm·cm,
- a low electrical resistivity of the support substrate, i.e., typically lower than $10^{-3}$ ohm·cm,
- a high thermal conductivity of the heterostructure, i.e., typically greater than or equal to 100 W/m·K,
- a low dislocation density in the active layer, i.e., of less than or equal to $10^7$ cm$^{-2}$.

In the case of electronic power components, the active layer of the heterostructure shall comprise a main portion with a thickness representing between 70 and 100% of the thickness of the active layer, the main portion being weakly doped so as to enable a dispersion of the electric field over the thickness of the active layer.

In the present text, "layer portion" is understood to refer to a part of a layer considered in the sense of the thickness of the layer. Thus, a layer may be constituted of several stacked portions, the sum of the thicknesses of portions being equal to the total thickness of the layer. The different portions of the active layer may be in the same material, but with different doping, or rather may be in different materials of composition $Al_xIn_yGa_{(1-x-y)}N$, where $0 \leq x \leq 1$, $0 \leq y \leq 1$ and $x+y \leq 1$.

Thus, the active layer of a PIN diode may be designed with alternating InGaN/GaN/InGaN or doped p GaN/weakly doped GaN/doped n GaN layers.

The active layer for optoelectronic or photovoltaic components may be constituted of a stack of layers in different materials of composition AlxInyGa(1-x-y)N, where $0 \leq x \leq 1$, $0 \leq y \leq 1$ and $x+y \leq 1$.

In addition, "subjacent" designates a layer portion the farthest removed from the surface of the heterostructure and "superjacent" designates a layer portion closest to the surface of the heterostructure. By way of example, the active layer of a PIN diode comprises a single subjacent and superjacent layer on both sides of the main portion.

Another object of the invention is to design a support adapted for epitaxy of the active layer in view of forming the heterostructure described above.

More precisely, this epitaxy support must enable growth of the thick active layer without forming cracks and must in addition present electric properties compatible with the intended applications.

BRIEF DESCRIPTION OF THE INVENTION

For this purpose, a first object of the invention relates to a heterostructure for the manufacture of electronic power components, optoelectronic components or photovoltaic components comprising successively from its base to its surface:
- a support substrate in a material presenting an electrical resistivity of less than $10^{-3}$ ohm·cm and a thermal conductivity of greater than 100 W·m$^{-1}$·K$^{-1}$,
- a bonding layer,
- a monocrystalline seed layer in a material of composition $Al_xIn_yGa_{(1-x-y)}N$, where $0 \leq x \leq 1$, $0 \leq y \leq 1$ and $x+y \leq 1$,
- a monocrystalline layer, so-called "active layer", of a material of composition $Al_xIn_yGa_{(1-x-y)}N$, where $0 \leq x \leq 1$, $0 \leq y \leq 1$ and $x+y \leq 1$.

This heterostructure is remarkable in that:
- the active layer is a crack-free monocrystalline layer presenting a thickness of between 3 and 100 micrometers;
- the specific contact resistance between the seed layer and the bonding layer is less than or equal to 0.1 ohm·cm$^2$, and
- the materials of the support substrate, the bonding layer and the seed layer are refractory at a temperature of greater than 750° C., preferably at a temperature of greater than 1000° C., and
- the seed layer presents a difference in the lattice parameter with the material of the active layer of less than 0.005 Å.

As will be apparent in the detailed description to follow, the support of the heterostructure, i.e., the support composed of the support substrate, the bonding layer and the seed layer is, on the one hand, suited for the epitaxial growth of the active layer and, on the other hand, presents the required properties for the operation of the components that are made or on in the active layer.

In other words, the support that is used to grow the active layer is designed so as to have thermal and electrical properties that render it also suitable for the subsequent operation of the components, without any need to be replaced by another support in view the operation of the components.

In the present text, "refractory material" is understood to refer to a material that does not deteriorate at the epitaxy temperature of the layer of material of composition AlxIny Ga$_{(1-x-y)}$N (whether by melting or chemical reaction with gas components), and in which the electrical and thermal conductivity characteristics are not altered at this temperature (particularly by deterioration of the interfaces with other support layers).

It is specified that, in the whole of the present text, the coefficient of thermal expansion is considered to be the linear coefficient of thermal expansion along a plane parallel to the surface of the layers at the epitaxy temperature of the active layer with relation to the bonding temperature. The vapor phase epitaxy temperature of the active layer of type AlGaInN is conventionally less than 1100° C. Bonding is generally carried out at ambient temperature.

The coefficient of thermal expansion is conventionally measured by X-ray diffraction or by dilatometry.

Electrical conductivity (or electrical resistivity) and specific contact resistance are measured by standardized methods that are well known to the person skilled in the art and detailed, for example, in the book titled "Semiconductor Material and Device Characterization" by Dieter Schöder (John Wiley & Sons). Specific contact resistance is measured, for example, by TLM ("Transmission Line Method" or "Transfer Length Method"). This method consists of depositing metal contacts with a length l and a width w, spaced apart by a distance Li over the layer of semiconductor material with a thickness h. Resistance Ri is measured between different contacts so as to measure several resistance values for different distances Li between the contacts. These values are transferred to an orthogonal mark whose axes represent the resistances Ri and the distances Li. The slope and the zero distance point of the straight line obtained by joining the points enables the resistivity of the semiconductor material and the specific contact resistance to be respectively extracted.

Thermal conductivity is measured by standardized methods well known to the person skilled in the art and are detailed, for example, in the treatise R-2-850 "Conductivité et diffusivité thermique des solides" [Conductivity and thermal diffusivity of solids] by Alain Degiovanni, published by Techniques de l'Ingénieur.

Dislocation density may be measured by transmission electron microscopy or by cathodoluminescence.

According to other characteristics of the heterostructure, considered alone or in combination:
- the active layer presents a dislocation density of less than $10^8$ cm$^{-2}$, and preferably less than $10^7$ cm$^{-2}$;
- the seed layer is doped with a concentration of dopants of between $10^{17}$ and $10^{20}$ cm$^{-3}$;
- the dopants are preferably n-type dopants;
- the material of the support substrate is a metal chosen from among tungsten, molybdenum, niobium and/or tantalum and their binary, ternary or quaternary alloys, such as TaW, MoW, MoTa, MoNb, WNb or TaNb;
- advantageously, the support substrate is in TaW comprising at least 45% tungsten or in MoTa comprising more than 65% molybdenum;
- the material of the bonding layer comprises polycrystalline silicon, silicide, preferably tungsten silicide or molybdenum silicide, tungsten, molybdenum, zinc oxide, a metal boride such as zirconium boride, tungsten boride, titanium boride or chromium boride, and/or indium tin oxide;
- the bonding layer is preferentially in a material presenting an electrical resistivity of less than or equal to $10^{-4}$ ohm·cm;
- the seed layer presents an electrical resistivity of between $10^{-3}$ and 0.1 ohm·cm.

When the heterostructure is intended for the manufacture of electronic power components, the active layer presents a main portion in which the thickness represents between 70 and 100% of the thickness of the active layer and in which the concentration of dopants is less than or equal to $10^{17}$ cm$^{-3}$, and the coefficient of thermal expansion of the support substrate material is between a minimum coefficient of less than $0.5 \cdot 10^{-6}$ K$^{-1}$ to that of the coefficient of thermal expansion of the material of the main portion of the active layer and a maximum coefficient of greater than $0.6 \cdot 10^{-6}$ K$^{-1}$ to the coefficient of thermal expansion of the material of the main portion of the active layer at the formation temperature by epitaxy of the active layer.

According to a particular embodiment of the heterostructure, the main portion of the active layer is inserted between a subjacent layer and a superjacent layer, each comprising a concentration of different type dopants greater than $10^{17}$ $cm^{-3}$. The material of the main portion and of the subjacent and superjacent portions is then preferably GaN.

According to another embodiment of the heterostructure, the main portion of the active layer is inserted between a subjacent portion and a superjacent portion, each of these portions being constituted of a material $Al_xIn_yGa_{(1-x-y)}N$ of a different composition.

According to another embodiment of the heterostructure, the thickness of the main portion represents 100% of the thickness of the active layer and the material of the main portion is n-type doped GaN, preferably silicon doped GaN.

Preferably, the main portion of the active layer and the seed layer are constituted of the same material.

In an example of embodiment of the heterostructure, the support substrate is in molybdenum, the bonding layer is in tungsten, the seed layer is in GaN and the active layer is in GaN.

Another object of the invention is an electronic power, optoelectronic or photovoltaic component formed in or on the active layer of the heterostructure described above, and comprising at least one electrical contact on the active layer and one electrical contact on the support substrate.

Another object of the invention relates to a method of manufacturing a heterostructure for the manufacture of electronic power components, optoelectronic components or photovoltaic components, characterized in that it comprises:
(a) the provision of a support substrate presenting an electrical resistivity of less than $10^{-3}$ ohm·cm and a thermal conductivity of greater than 100 W·m$^{-1}$·K$^{-1}$,
(b) the provision of a donor substrate, the substrate comprising a monocrystalline seed layer adapted for the epitaxial growth of the layer,
(c) the formation of a bonding layer on the donor substrate and/or on the support substrate,
the materials of the support substrate, the seed layer and the bonding layer are chosen to be refractory at a temperature greater than 750° C., preferably at a temperature greater than 1000° C., and chosen such that the specific contact resistance between the seed layer and the bonding layer is less than or equal to 0.1 ohm·cm$^2$,
(d) bonding by molecular adhesion of the donor substrate on the support substrate, the bonding layer being situated at the interface,
(e) thinning of the donor substrate to transfer it from the seed layer to the support substrate,
(f) growth by epitaxy of a monocrystalline layer, so-called "active layer," of a material of composition $Al_xIn_yGa_{(1-x-y)}N$, where $0 \leq x \leq 1$, $0 \leq y \leq 1$ and $x+y \leq 1$, on the seed layer, without cracking, until a thickness of between 3 and 100 micrometers is obtained,
wherein the material of the seed layer is chosen to present a lattice parameter difference with the material of the main portion of the active layer of less than 0.005 Å.

According to other characteristics of the method, considered alone or in combination:
the active layer presents a main portion whose thickness represents between 70 and 100% of the thickness of the active layer (4) and whose concentration of dopants is less than or equal to $10^{17}$ cm$^{-3}$ and the material of the support substrate is chosen such that its coefficient of thermal expansion is between a minimum coefficient of less than $0.5 \times 10^{-6}$ K$^{-1}$ to the coefficient of thermal expansion of the material of the main portion of the active layer and a maximum coefficient of greater than $0.6 \times 10^{-6}$ K$^{-1}$ to the coefficient of thermal expansion of the material of the main portion of the active layer at the epitaxy temperature of the active layer;
the method advantageously comprises doping of the active layer, the doping being carried out for epitaxy step (f) or, after epitaxy, by implantation or diffusion of dopant species;
preferably, the material of the support substrate is a metal chosen from among tungsten, molybdenum, niobium and/or tantalum and their binary, ternary or quaternary alloys, such as TaW, MoW, MoTa, MoNb, WNb or TaNb;
the seed layer is formed in the donor substrate by ionic implantation so as to create in the donor substrate an embrittlement zone at a depth substantially equal to the thickness of the seed layer;
the implantation step is carried out after the formation of the bonding layer on the donor substrate, the implantation being carried out through the bonding layer;
the method comprises doping of the seed layer, the doping being carried out by implantation or diffusion of dopant species;
when the roughness of the donor substrate or support substrate is less than 1 nm for a 5 micrometer×5 micrometer surface measured by AFM and presents a peak valley surface topology of less than 10 nm, the bonding layer is only deposited on the other substrate;
when the roughness of the support substrate is greater than or equal to 1 nm for a 5 micrometer×5 micrometer surface measured by AFM and presents a peak valley surface topology greater than or equal to 10 nm, the bonding layer is deposited and polished until a roughness of less than 1 nm and a peak valley surface topology of less than 10 nm is reached.

BRIEF DESCRIPTION OF THE FIGURES

Other objects, characteristics, and advantages of the invention will emerge from the following detailed description, with reference to the attached drawings in which.

It is specified that, for reasons of figure readability, the scales of thickness of the different layers have not been respected.

DETAILED DESCRIPTION OF THE INVENTION

Figure 1:
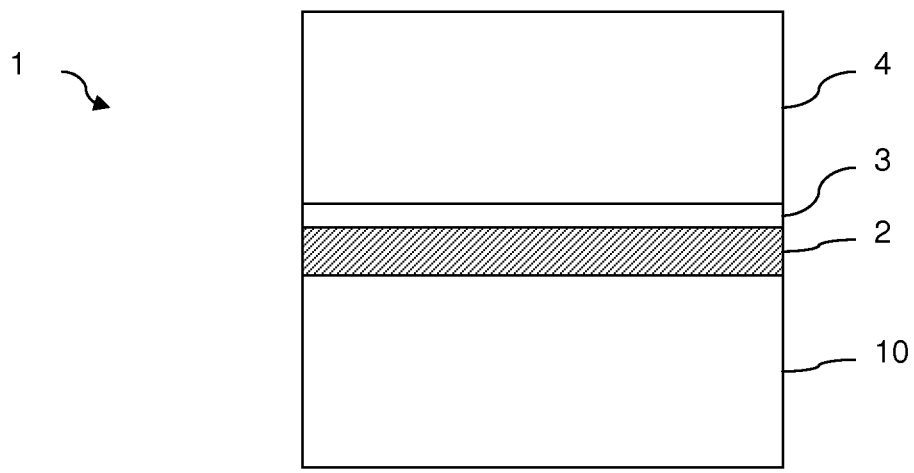
FIG. 1 illustrates a heterostructure in conformance with the invention.

With reference to FIG. 1, a heterostructure 1 proposed in the present invention comprises an active layer 4 of a material of composition $Al_xIn_yGa_{(1-x-y)}N$, where $0 \leq x \leq 1$, $0 \leq y \leq 1$ and $x+y \leq 1$.

Layer 4 is called active since it is the layer in or on which the electronic power components such as MOS, J-FET, MIS-FET, Schottky diodes or even thyristors; or LED components, lasers, solar cells are intended to be formed.

The thickness of the active layer 4 is between 3 and 100 micrometers, preferably between 3 and 20 micrometers, further preferably on the order of 10 micrometers.

The active layer 4 is bonded onto a support substrate 10 through a bonding layer 2 whose properties will be detailed below.

The active layer 4 is formed by epitaxy on a seed layer 3 that, as will be seen later, may be in the same material as that of the active layer 4 or in a different material.

The manufacturing method of such a heterostructure 1, which will be described in detail later, mainly comprises the following steps:

the provision of the support substrate 10;
the provision of a donor substrate comprising a seed layer 3 adapted for the epitaxy of the active layer 4;
the transfer of the seed layer 3 to the support substrate 10, the bonding layer 2 mentioned above being formed at the interface;
the growth by epitaxy of the active layer 4 on the seed layer 3.

The assembly of the support substrate 10, the bonding layer 2 and the seed layer 3, which constitutes a support for the epitaxy of the active layer 4 allowing the heterostructure illustrated in FIG. 1 to be formed, presents a total electrical resistivity of less than or equal to that of the bulk GaN comprising a dopant concentration of $10^{18}$ cm$^{-3}$, i.e., a total electrical resistivity of less than or equal to $10^{-2}$ ohm·cm and preferentially a thermal conductivity on the order of magnitude as that of the GaN, i.e., greater than or equal to 100 W/m·K so as to propose an alternative to the utilization of a bulk GaN substrate, that is difficult to find on the market and is expensive.

Thus, heterostructure 1 such as defined above presents a sufficient vertical electrical conductivity for the intended applications such as the operation of Schottky diodes.

In addition, the materials constituting heterostructure 1 and the manufacturing methods are chosen such that the heterostructure may resist epitaxy temperatures of the active layer without deteriorating the materials or their electrical and thermal properties and thus enable operation of devices equivalent to devices formed from a bulk III/N material.

Support Substrate

A support substrate 10 is in a material presenting an electrical resistivity of less than $10^{-3}$ ohm·cm and a thermal conductivity of greater than 100 W·m$^{-1}$·K$^{-1}$.

The material of the support substrate 10 is also "refractory," i.e., it presents thermal stability at active layer formation temperatures.

It presents a coefficient of thermal expansion close to that of the material of active layer 4 at epitaxy temperature to prevent stressing of the epitaxied layer during the heating preceding growth and during cooling of the heterostructure after epitaxy.

For example, the epitaxy temperature in vapor phase by MOCVD, HVPE of the GaN and the AlN to date is around 1000° C.-1100° C., and around 800° C. for InGaN and $Al_xIn_yGa_{(1-x-y)}N$.

In fact, if the coefficient of thermal expansion of the support substrate 10 is less than (respectively, greater than) that of the seed layer 3, the seed layer 3 will be in compression (respectively, in tension) at the epitaxy temperature.

Such being the case, this constraint in tension or in compression may be harmful to the quality of the epitaxy.

In addition, if the epitaxied layer 4 is relaxed during the epitaxy and its coefficient of thermal expansion is greater than (respectively, less than) that of the support substrate 10, it will be in tension (respectively, in compression) during cooling.

Beyond a threshold thickness, the constraints in tension as in compression are likely to relax by the formation of cracks or crystalline defects in the epitaxied layer, which reduces the efficacy of the devices formed from this layer.

The sufficiently "close" character of the coefficient of thermal expansion of the support substrate with relation to that of the active layer is determined as a function of the predominant material chosen for the active layer, i.e., the material of the main portion where appropriate.

Thus, for example, for an active layer 4 in GaN (whose coefficient of thermal expansion is on the order of $5.6 \cdot 10^{-6}$ K$^{-1}$), the support substrate 10 may present a coefficient of thermal expansion of between $5.1 \cdot 10^{-6}$ and $6.1 \cdot 10^{-6}$ K$^{-1}$ at the epitaxy temperature of the active layer.

In general, it is considered that the coefficients of thermal expansion of the active layer (noted $CTE_{active\ layer}$) and of the support substrate (noted $CTE_{support}$) must be linked by the following relationship:

$$CTE_{active\ layer} - 0.5 \cdot 10^{-6}\ K^{-1} \leq CTE_{support} \leq CTE_{active\ layer} + 0.6 \cdot 10^{-6}\ K^{-1}$$

The support substrate 10 is metal-based and is preferably chosen from among tungsten (W), molybdenum (Mo), niobium (Nb) and/or tantalum (Ta) and their binary, ternary or quaternary alloys, such as TaW, MoW, MoTa, MoNb, WNb or TaNb.

In particular, the TaW alloy comprising at least 45% tungsten (preferably 75%) is likely to present a coefficient of thermal expansion in accordance with that of GaN while possessing good thermal and electrical conductivity properties.

The MoTa alloy comprising more than 65% molybdenum is also suitable.

The characteristics of some materials are found in the table below, for indicative purposes.

| | CTE at ambient temperature ($10^{-6}$ K$^{-1}$) | CTE at 1000° C. ($10^{-6}$ K$^{-1}$) | Thermal conductivity (W/mK) | Electrical resistivity (microohm · cm) |
|---|---|---|---|---|
| Mo metal | 4.8 | 5.6-6.0 | 140 | 5 |
| W metal | 4.5 | 5.1 | 165 | 5 |
| Ta metal | 6.3 | 7.0 | 54 | 13 |
| Nb metal | 7.3 | 8.3 | 54 | 15 |
| GaN | 3.5 | 5.6 | 150 | |

The support substrate 10 is obtained, for example, by sintering (for the W for example) or by hot pressing.

Depending on the nature of the material of the support substrate 10 and the epitaxy temperature of the active layer 4 (for a material of the AlInGaN type, this varies between 800° C. and 1100° C.), evaporation or diffusion of the support substrate may be produced, with the effect of contaminating the active layer.

In this case, one may encapsulate the support substrate 10 by a protective layer (not represented) in view of the application of thermal budgets of active layer growth. For example, a layer of silicon nitride or aluminum nitride may be deposited on the rear face and the lateral faces of the support substrate by a CVD or PVD deposition (respectively "Chemical Vapor Deposition" and "Phase Vapor Deposition").

Seed Layer

The monocrystalline seed layer 3 is in an $Al_xIn_yGa_{(1-x-y)}N$ material, where $0 \le x \le 1$, $0 \le y \le 1$ and $x+y \le 1$ and is electrically conductive. The layer is obtained by transfer to the support substrate 10 from a donor substrate 30, which may be bulk or rather formed of several layers (for example, a layer of GaN deposited on a sapphire support).

The material of the seed layer 3 is refractory, i.e., it does not deteriorate during epitaxy of the active layer.

The seed layer 3 transfer method is obtained by a step of bonding the donor substrate 30 by molecular adhesion on the support substrate 10 followed by a step of thinning the donor substrate 30 to obtain the seed layer 3. This thinning may be carried out by any technique adapted to the materials utilized and whose implementation is well known to the person skilled in the art, such as chemical mechanical polishing CMP, grinding, laser irradiation at the interface between two layers constituting the donor substrate or preferably a SMARTCUT®-type method. A detailed description of this method may, for example, be found in European Patent EP0533551 or in the book "Procédé SMARTCUT dans Silicon-On-Insulator Technology: Materials to VLSI (SMARTCUT Method in Silicon-on-Insulator Technology), 2nd Edition by Jean-Pierre Colinge from Kluwer Academic Publishers, p. 50 and 51.

Figure 2:
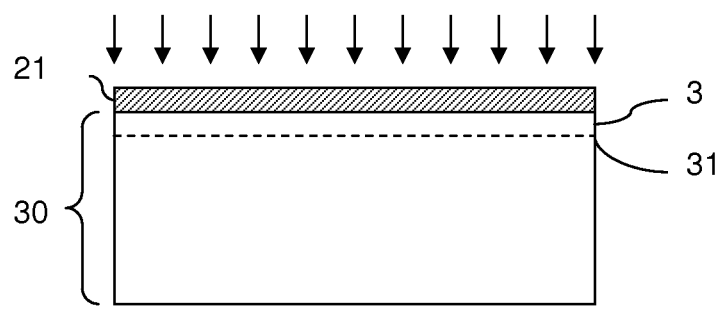
FIG. 2 schematically illustrates the formation of the seed layer in the donor substrate.

Schematically, with reference to FIG. 2, the seed layer 3 is defined in the donor substrate 30 by carrying out an implantation of ionic species (for example, hydrogen) in which the implantation peak of the species has a depth substantially equal to the desired thickness for the seed layer 3. The zone with the maximum implanted species concentration constitutes an embrittlement zone 31 that may be fractured by the application, for example, of an adapted thermal budget.

The thickness of the seed layer is preferentially between 100 nm and 500 nm.

The material chosen for the seed layer 3 preferably presents a lattice parameter adapted to the epitaxial growth of the active layer 4.

Preferably a material presenting a difference in lattice parameter with the material of the active layer 4 of less than 0.005 Å is chosen.

For example, one may thus carry out an epitaxy of InGaN at 1.4% In on a seed layer of GaN, or rather an epitaxy of AlGaN at 6.5% Al on a seed layer of GaN.

According to another example, for epitaxy of an active layer of GaN of a thickness of between 3 and 100 micrometers, one may remove a seed layer from a bulk substrate of GaN.

Preferably, the seed layer 3 is removed from the N polarity face of the donor substrate 30 such that the layer bonded to the support substrate 10 presents an exposed face of Ga polarity, from which the resumption of epitaxy is easier with current techniques.

Nevertheless, one may also remove the seed layer from the Ga polarity face of the donor substrate so as to carry out epitaxy on the N polarity face of the seed layer or carry out a double transfer so as to obtain an exposed face of the seed layer of Ga polarity.

Ideally, the material of the seed layer 3 is the same as that of the epitaxied active layer 4 (this is then homoepitaxy).

It then presents the same crystalline structure and, provided that the support substrate does not lead to constraints in the seed layer, there is no lattice parameter difference between the material of the seed layer and that of the active layer, which prevents the formation of new defects in the epitaxied crystal.

Homoepitaxy (active layer of GaN epitaxied on a seed layer of GaN) thus enables the lowest possible dislocation density to be obtained in the active layer.

In the case of homoepitaxy, the seed layer may be distinguished from the active layer by a difference in resistivity of these two layers when the active layer and the seed layer present different doping. In the absence of doping, it is sometimes possible to distinguish the interface between the two layers by TEM (Transmission Electron Microscopy).

In addition, the seed layer 3 advantageously presents an electrical resistivity of between $10^{-3}$ and 0.1 ohm·cm.

This resistivity is preferably the lowest possible resistivity, approximately $10^{-3}$ ohm·cm, in order to facilitate making ohmic contact with the support substrate, which corresponds to a concentration of dopants of between $10^{17}$ and $10^{20}$ $cm^{-3}$.

The material of the seed layer 3 and its level of doping are chosen so as to prevent constituting an electrical conduction barrier between the active layer 4 and the support substrate 10 of the final heterostructure.

The desired dopant may already be present in the layer removed from the donor or doping may be carried out by diffusion or implantation of dopant species before epitaxy of the active layer 4, depending on the desired device. Preferably, this n-type doping (for example by silicon) is easier to carry out, especially as it facilitates making electrical contact with the bonding layer 2.

In addition, the seed layer 3 is sufficiently thin (between 100 nm and 500 nm, for example) so that the effect of its coefficient of thermal expansion is negligible compared to that of the support substrate 10 and that of the active layer 4.

Active Layer

To respond to the conductivity criterion of heterostructure 1 and to be able to support a large electric field (i.e., on the order of $10^6$ $V \cdot cm^{-1}$), when the heterostructure 1 is intended for electronic power components, the epitaxied active layer 4 of $Al_xIn_yGa_{(1-x-y)}N$ comprises dopants with a concentration of less than or equal to $10^{17}$ $cm^{-3}$, in order to disperse as much as possible the electric potential drop over the entire thickness of the layer.

Doping is obtained, for example by incorporating silicon, which leads to n-type doping.

Doping may be carried out during growth of the active layer 4.

Thanks to the choice of the material of the seed layer 3, the dislocation density in the active layer is less than $10^8$ $cm^{-2}$, preferably less than $10^7$ $cm^{-2}$.

In addition, a wise choice of the support substrate 10, such as stated above, enables a thick active layer 4, free from cracks, to be obtained over a thickness of between 3 and 100 micrometers, preferably approximately 10 micrometers.

By way of information, it is specified that the term "crack" in the present invention is differentiated from dislocation in that the crack in a film of crystalline material corresponds to a crystalline cleavage that extends more or less deeply in the thickness of the film, i.e., a separation of the material into two parts, which creates, on both sides of the cleavage, two free surfaces in contact with air, while the film comprising a dislocation remains continuous.

According to a preferred embodiment, active layer 4 is made of GaN.

Figure 6:
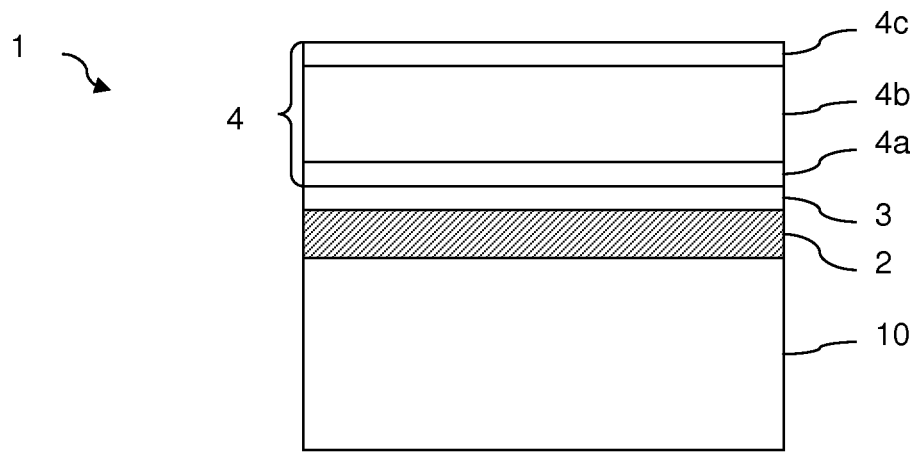
FIG. 6 illustrates another example of a heterostructure in conformance with the invention.

According to a particular embodiment illustrated in FIG. 6, active layer 4 is composed of a plurality of portions of layers, that is, by going from the bonding layer to the free surface of the active layer: a portion 4a of doped n-type GaN, a main portion 4b, whose thickness is greater than or equal to 70% of the total thickness of the active layer, of weakly doped GaN (i.e., with a concentration of less than or equal to 10'17 cm$^{-3}$) and a portion 4c of doped p-type GaN, or conversely.

According to another example, the active layer 4 of a PIN diode is constituted of a main portion 4b of GaN, a subjacent portion 4a of InGaN and a superjacent portion 4c of InGaN.

As is well known to the person skilled in the art, these dopings enable the desired electrical contacts to be obtained, for example in view of producing a PIN diode.

Preferably, doping of the active layer 4 is carried out during epitaxy, with a precursor gas such as silane for n-type doping to silicon, or a precursor such as CP$_2$Mg for p-type doping to magnesium.

Alternately, doping may be obtained by implantation (for example silicon for n-type doping, or magnesium for p-type doping) or yet, for the superjacent portion, by diffusion of species in the portion (for example silicon for n-type doping, magnesium for p-type doping).

Bonding Layer

A bonding layer is made in one or more materials chosen such that the bonding energy between the support substrate and the implanted donor substrate is greater than the fracture thermal budget.

Competition between the fracture at the embrittlement zone 31 and the separation of substrates 10, 30 at the bonding interface, which leads to a partial, poor-quality fracture of the embrittlement zone, is thus avoided.

In particular, the bonding layer is in a refractory material that does not deteriorate at the epitaxy temperature of the active layer.

In addition, the material of bonding layer 2 and its thickness are chosen so as to minimize the electric potential drop at the bonding.

Generally, the thickness of bonding layer 2 is thus less than or equal to 1 micrometer.

This thickness may be greater depending on the roughness of the substrate on which it is formed that it is necessary to smooth for effective bonding; In this case, the electric potential drop will be minimized by the choice of a material presenting a lower electrical resistivity.

Preferably, bonding layer 2 is electrically and thermally conductive, and the material composing the layer preferably presents an electrical resistivity of less than or equal to $10^{-4}$ ohm·cm.

However, considering that its thickness is much less than that of the support substrate, the influence of electrical and thermal conductivities of the material constituting the layer remains limited.

It is therefore possible to choose for this layer other materials than metals.

The bonding layer 2 in addition enables low electrical contact resistance between one of its faces and the active layer on the one hand, and between its other face and the support substrate on the other hand.

It is particularly desirable that the specific contact resistance between bonding layer 2 and seed layer 3 is less than or equal to 0.1 ohm-cm$^2$ in order to maintain good vertical electrical conductivity despite an interface presenting a semiconductor material.

To do this, the materials from bonding layer 2 and seed layer 3 are chosen such that their output energy, i.e., minimum energy, measured in electron-volts, necessary to detach an electron from the Fermi level of a material until a point situated at infinity outside the material, is in the same order of magnitude.

A material pair satisfying this requirement is for example GaN/W, the output energy of the n-type doped GaN being approximately 4.1 eV while that of the W is approximately 4.55 eV. Another pair considered may be GaN/ZrB2 (the output energy of ZrB2 is approximately 3.94 eV).

A layer of titanium may also promote adhesion and making contact between the material of the seed layer in III/N material and the bonding layer, since it participates in lowering the height of the conduction barrier at the interface (the output energy of Ti is approximately 4.33 eV).

A layer of titanium with a thickness of 10 nm deposited on the material of seed layer 3 or the material of bonding layer 2 before assembly is sufficient to obtain the anticipated effect.

Thermal annealing of the two materials also enables the specific contact resistance to be improved by better interconnection of the materials at the interface.

The bonding layer is deposited on donor substrate 30 before implantation and/or on support substrate 10. The act of carrying out implantation in the donor substrate after deposition of the bonding layer prevents the risk of a fracture at the implanted zone due to the thermal budget produced by the deposition.

When layers of bonding material are deposited on both the donor substrate and the support substrate, bonding layer 2 is constituted of the whole of these two layers.

It is noted that when the roughness of one of the substrates (i.e., of the donor substrate or of the support substrate) is less than 1 nm for a 5 micrometer×5 micrometer surface measured by atomic force microscopy (AFM) and when it presents a peak valley surface topology of less than 10 nm measured by optical profilometry with a Wyko-type apparatus, the bonding layer only has to be deposited on the other substrate. It is observed that the measured roughness is generally similar for a surface ranging from 1 micrometer×1 micrometer to 10 micrometers×10 micrometers.

Polycrystalline silicon (p-Si) is a material of choice that adheres well to the GaN, which enables planarization of the surface of the metallic support substrate and which is easy to polish.

A surface roughness before bonding of, at the most, a few angstroms rms may thus be reached.

To minimize the possible diffusion of silicon to the epitaxied layer 4, a diffusion barrier (not represented) may be provided, for example between the seed layer and the bonding layer. For example, this diffusion barrier may be a film of AlN of a few nanometers of thickness.

In the case of diffusion of silicon in vapor phase during epitaxy from the lateral walls of the layer to the outside of the structure, a layer forming a diffusion barrier of the lateral zones not covered by the p-Si layer may be provided.

Alternately, one may also form the bonding layer 2 by depositing a metal (for example tungsten or molybdenum), a metal oxide such as zinc oxide, a silicide formed ex-situ (for example SiW$_2$ or SiMo) or a metal boride (such as TiB$_2$, chromium boride, zirconium boride or tungsten boride) on the donor substrate 30 before implantation and/or on the support substrate 10.

In a variation, it is possible to deposit a metal on the donor substrate 30 or the support substrate 10 and to deposit a silicide or a boride on the other substrate; the bonding layer 2 will then be constituted of the combination of this metal with the silicide or the boride.

Another possibility consists of making the bonding layer 2 in indium tin oxide (ITO).

As the indium tin oxide is thermally unstable, it is preferably encapsulated before carrying out epitaxy of the active layer 4.

The table below gives the properties of some of the materials that are suitable for bonding layer 2.

The characteristic indicated in line Li is the melting point (expressed in ° C.); the characteristic of line L2 is the thermal conductivity (in $W \cdot m^{-1} \cdot K^{-1}$); that of line L3 is the electrical resistivity (in ohm·cm) and that of line L4 is the coefficient of thermal expansion (in $10^{-6} K^{-1}$).

|    | p-Si              | $MoSi_2$          | $TaSi_2$          | $WSi_2$           | $NbSi_2$          |
|----|-------------------|-------------------|-------------------|-------------------|-------------------|
| L1 | 1412              | 1870              | 2499              | 2320              | 2160              |
| L2 | 130               | 58.9              |                   |                   |                   |
| L3 | $1.0 \cdot 10^{-4}$ | $2.2 \cdot 10^{-5}$ | $8.5 \cdot 10^{-6}$ | $3.0 \cdot 10^{-5}$ | $5.0 \cdot 10^{-5}$ |
| L4 |                   | 8.12              |                   | 8.8-9.54          |                   |

|    | $ZrB_2$           | $WBx$             | $TiB_2$                  | $CrB_2$           |
|----|-------------------|-------------------|--------------------------|-------------------|
| L1 | 3060              | 2385              | 2980                     | 1850-2100         |
| L2 | 58                |                   | 64                       | 20-32             |
| L3 | $9.2 \cdot 10^{-6}$ | $4.0 \cdot 10^{-6}$ | $1.6\text{-}2.8 \cdot 10^{-5}$ | $2.1 \cdot 10^{-5}$ |
| L4 |                   |                   |                          |                   |

Example of Embodiment No. 1

Bonding Layer in p-Si

First the donor substrate 30 is prepared by the following steps (see FIG. 2):
  Preparation of the N polarity face of a bulk substrate 30 of GaN. This step involves known planarization and polishing techniques.
  CVD or PVD deposition on the face of layer 21 of p-Si with a thickness of 100 to 500 nm.
  Implantation in the donor substrate 30 of ionic species (of hydrogen, for example) through layer 21 of p-Si. The depth of implantation determines the thickness of the seed layer 3 of GaN. For indicative purposes, the implantation energy is between 80 and 180 keV and the dose is between 2 and $4 \cdot 10^{17}$ at/cm².
  Polishing by CMP (Chemical Mechanical Polishing) of layer 21 to reach a roughness compatible with bonding. Typically, the roughness before bonding must be on the order of a few angstroms rms.

Figure 3:
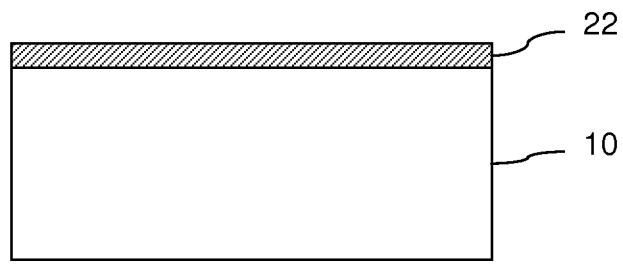
FIG. 3 illustrates the formation of a bonding layer on the support substrate.

Second, with reference to FIG. 3, the support substrate 10 is prepared, which is in a TaW alloy containing 75% tungsten.

This preparation comprises the deposition on support substrate 10 of a layer 22 of p-Si with a thickness of a few hundred nanometers.

The thickness of layer 22 is adapted as a function of the morphology of the surface of the support substrate 10, such that the planarization by CMP of the layer of p-Si enables a surface roughness of a few angstroms rms to be reached.

Then a chemical treatment prior to adhesion of the two layers 21, 22 of p-Si is carried out by hydrophilic or hydrophobic bonding.

For this purpose, the surfaces are cleaned to remove contaminants and an oxidizing or deoxidizing treatment is possibly performed on the surfaces by plasma activation, drying and exposure to atmospheres containing ozone (for oxidation). The surfaces to be bonded may also be preheated up to a temperature of approximately 200° C.

Figure 4:
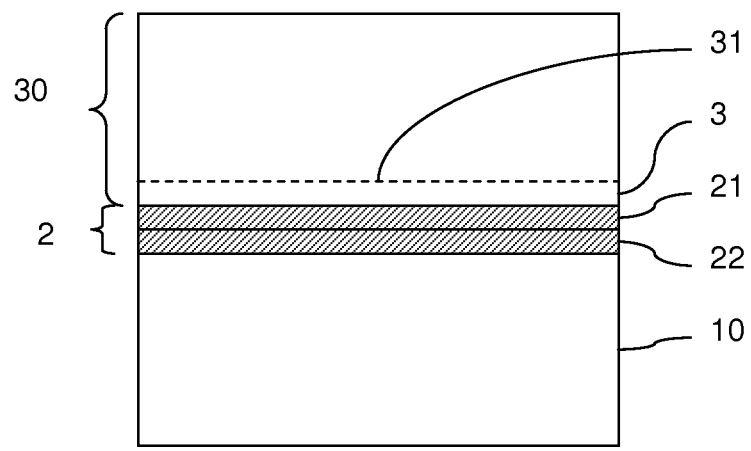
FIG. 4 illustrates the assembly of the donor substrate on the support substrate before the fracture.

With reference to FIG. 4, the surfaces of the two layers 21, 22 of p-Si are placed in contact; therefore a bonding layer 2 of p-Si with a total thickness of 100 nm to 1 micrometer is formed.

Optionally, bonding is consolidated by a thermal treatment applied from ambient temperature to approximately 200° C. with a duration of a few minutes to 2 hours.

Then the fracture thermal budget is applied with a temperature ramp of between ambient temperature and approximately 600° C.

Figure 5:
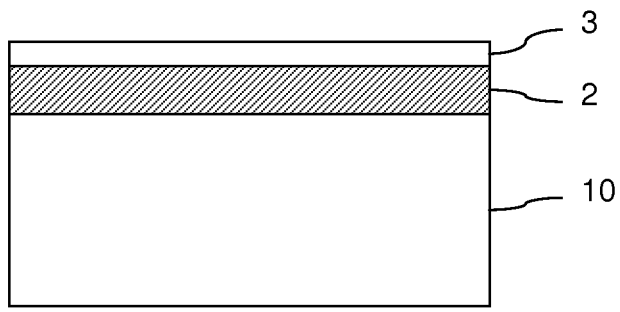
FIG. 5 illustrates the structure resulting from the fracture of the donor substrate.

The structure illustrated in FIG. 5 is then obtained.

The damaged material on the fractured surface is removed (i.e., the surface of seed layer 3) to reach a roughness of a few angstroms to a few nanometers rms, adapted for a resumption of epitaxy.

The heterostructure 1 illustrated in FIG. 1 is obtained by growing the active layer 4 on seed layer 3, on the desired thickness.

The residue of the donor substrate 30 may also be recycled by removing, by ion beam etching or chemical etching, the p-Si on the non-fractured face.

Example of Embodiment No. 2

Bonding Layer in $WSi_2$

First the donor substrate is prepared, which includes the following steps (see FIG. 2):
  Planarization and polishing of the N polarity face of a bulk substrate 30 of GaN.
  Deposition on the face of layer 21 of $WSi_2$ silicide with a thickness of 100 to 500 nm.
  Implementation of annealing to form ohmic contact with the GaN. This annealing is carried out at a temperature of between 600° C. and 1200° C. for a few minutes under neutral atmosphere comprising $NH_3$ and has the effect of reducing the contact resistance.
  Implantation of ionic species, such as hydrogen, through layer 21 of $WSi_2$ in the donor substrate 30 to a depth determining the thickness of the seed layer 3 of GaN. The implantation energy is typically between 80 and 180 keV.
  Polishing by CMP of the $WSi_2$ to reach a roughness compatible with bonding (i.e., a few angstroms rms).

Second, preparing the support substrate 10 in TaW comprising 75% tungsten. For this purpose (see FIG. 3), a layer 22 of $WSi_2$ with a thickness of a few hundred nanometers is deposited on substrate 10.

As stated above, the thickness of the layer 22 of $WSi_2$ is adapted as a function of the morphology of the surface of the support substrate 10 such that the planarization by CMP of the layer 22 of $WSi_2$ enables a surface roughness of a few angstroms rms to be reached.

If necessary, annealing to form ohmic contact with the TaW is carried out. The conditions of this annealing are a temperature of between 600° C. and 1200° C., a duration of a few minutes and a neutral atmosphere.

Planarization by CMP of the surface of the $WSi_2$ is then carried out.

Then a chemical treatment prior to adhesion of the two layers of $WSi_2$ is carried out by hydrophilic or hydrophobic bonding.

For this purpose, the surfaces are cleaned to remove contaminants and an oxidizing or deoxidizing treatment is possibly performed on the surfaces by plasma activation, drying and exposure to atmospheres containing ozone (for oxidation). The surfaces to be bonded may also be preheated up to a temperature of approximately 200° C.

The surfaces of the two layers 21, 22 of $WSi_2$ are then placed in contact; therefore a bonding layer 2 of $WSi_2$ with a total thickness of 100 nm to 1 micrometer is formed.

Optionally, bonding is consolidated by a thermal treatment applied from ambient temperature to approximately 200° C. with a duration of a few minutes to 2 hours.

Then the fracture thermal budget is applied with a temperature ramp of between ambient temperature and approximately 600° C.

The damaged material on the fractured surface is removed (i.e., the surface of seed layer) by dry etching (RIE) or chemical mechanical polishing (CMP) to reach a roughness of a few angstroms to a few nanometers rms, adapted for a resumption of epitaxy.

The heterostructure 1 illustrated in FIG. 1 is obtained by growing the active layer 4 on seed layer 3, on the desired thickness.

The residue of the donor substrate may also be recycled by removing, by dry etching (for example by reactive ionic etching RIE) or wet etching (i.e., chemical etching), the $WSi_2$ on the non-fractured face.

Example of Embodiment No. 3

First the donor substrate 30 is prepared by the following steps (see FIG. 2):
  Preparation of the N polarity face of a bulk substrate 30 of GaN. This step involves known planarization and polishing techniques.
  CVD or PVD deposition on the face of layer 21 of W with a thickness of 100 to 500 nm.
  Implantation in the donor substrate 30 of ionic species (of hydrogen, for example) through layer 21 of W. The depth of implantation determines the thickness of the seed layer 3 of GaN. For indicative purposes, the implantation energy is between 80 and 180 keV and the dose is between 2 and $4 \cdot 10^{17}$ at/$cm^2$.
  Polishing by CMP (Chemical Mechanical Polishing) of layer 21 to reach a roughness compatible with bonding.

Typically, the roughness before bonding must be on the order of some angstroms rms.

Second, with reference to FIG. 3, the support substrate 10 is prepared, which is of molybdenum.

This preparation comprises the deposition on support substrate 10 of a layer 22 of W with a thickness of a few hundred nanometers.

The thickness of layer 22 is adapted as a function of the morphology of the surface of the support substrate 10, such that the planarization by CMP of the layer of W enables a surface roughness of a few angstroms rms to be reached.

Then the two surfaces of layers 21 and 22 of W are placed in contact for bonding by molecular adhesion, thus a bonding layer 2 of W with a total thickness of 100 nm to 1 micrometer is formed.

Optionally, bonding is consolidated by a thermal treatment applied from ambient temperature to approximately 200° C. with a duration of a few minutes to 2 hours.

Then the fracture thermal budget is applied with a temperature ramp of between ambient temperature and approximately 600° C.

The structure illustrated in FIG. 5 is then obtained.

The damaged material on the fractured surface is removed (i.e., the surface of seed layer 3) to reach a roughness of a few angstroms to a few nanometers rms, adapted for a resumption of epitaxy.

The heterostructure 1 illustrated in FIG. 1 is obtained by growing the active layer 4 of GaN on seed layer 3, on the desired thickness.

Components Based on the Heterostructure

The heterostructure 1 described above can then be used to form electronic power components, optoelectronic components or photovoltaic components in or on the active layer 4.

In particular, the components that can be based on the heterostructure comprise electronic power components such as MOS components, bipolar transistors, J-FET, MISFET, Schottky or PIN diodes, thyristors; optoelectronic components (e.g., Laser, LED) and photovoltaic components (solar cells).

To that end, at least one electrical contact may be formed on the active layer 4 of the heterostructure (which represents the "front side" of the component), and at least one electrical contact may be formed on the support substrate 10 of the heterostructure (which represents the "back side" of the component).

In the case of optoelectronic components, the active layer may be relatively thin, i.e., up to 6 micrometers.

In the case of photovoltaic or optoelectronic components, the contact formed on the active layer may be transparent or semitransparent in order to allow the transmission of the appropriate wavelength.

The skilled person is able to define an appropriate material for the contact so as to meet this requirement.

Example of an Electronic Power Component

Figure 7:
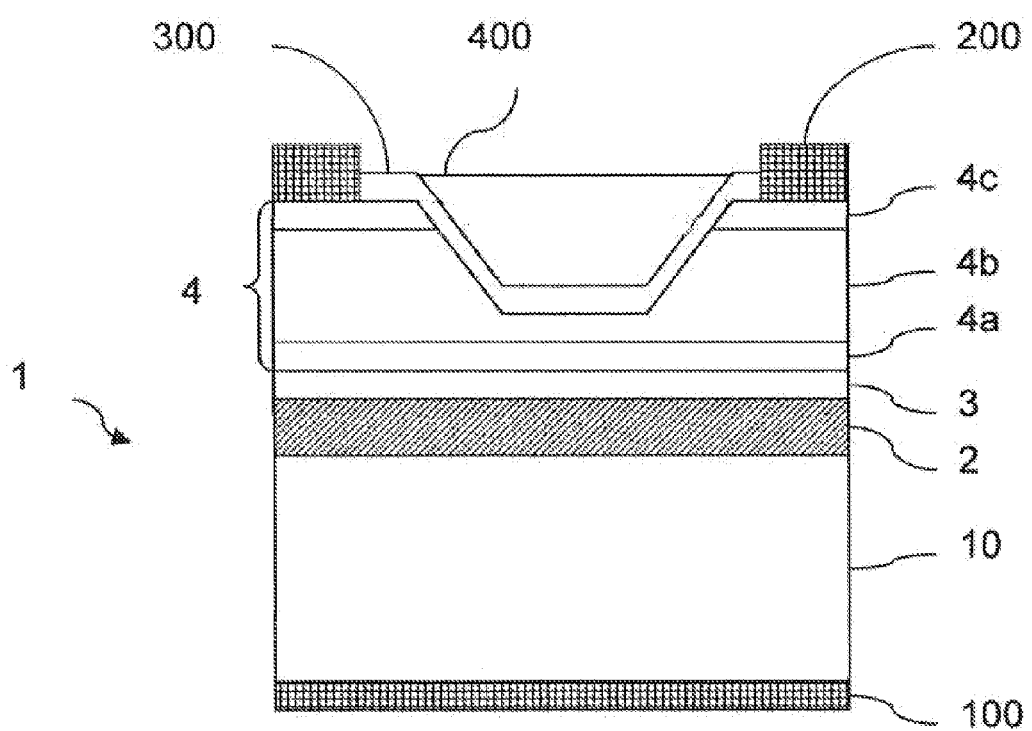
FIG. 7 illustrates an example of an electronic power component formed on a heterostructure in conformance with the invention.

FIG. 7 illustrates a vertical transistor with a vertical gate (also called a "trench gate MOSFET") made from heterostructure 1 obtained thanks to the present invention.

On the rear face of support substrate 10, a metallic layer 100 (for example, of aluminum) may be deposited to form a drain ohmic contact. However, the conductivity of the support substrate of the invention is chosen so as to not inevitably necessitate such a contact layer.

The active layer 4 of the heterostructure successively comprises a subjacent portion 4a of doped n– GaN, a main portion of doped p+GaN with magnesium, and two superjacent regions 4c of doped n+GaN for source contacts with layers 200 that are, for example, in an aluminum/titanium alloy.

The two regions 4c are deposited on both sides of a trench to form the vertical gate.

The gate trench is covered with a layer 300 of a dielectric substance (such as $SiO_2$ or SiN) and the trench is filled with polycrystalline silicon 400.

Of course, the embodiments that have just been described in detail are only examples of implementation of the present invention, but in no way constitute limitations.

In particular, the invention may be implemented with other choices of materials, according to the criteria stated above.

What is claimed is:

1. A heterostructure for the manufacture of electronic power components, optoelectronic components or photovoltaic components, comprising:
  a support substrate comprising a material presenting an electrical resistivity below $10^{-3}$ ohm·cm and a thermal conductivity that is above 100 W·$m^{-1}$·$K^{-1}$,
  a bonding layer upon the support substrate,
  a first layer upon the bonding layer, the first layer comprising a monocrystalline material of composition $Al_xIn_yGa_{(1-x-y)}N$, where 0≤x≤1, 0≤y≤1 and x+y≤1,
  a second layer upon the first layer, the second layer comprising a monocrystalline material of composition $Al_xIn_yGa_{(1-x-y)}N$, where 0≤x≤1, 0≤y≤1 and x+y≤1, and
  an active layer upon the second layer, the active layer comprising a monocrystalline material of composition $Al_xIn_yGa_{(1-x-y)}N$, where 0≤x≤1, 0≤y≤1 and x+y≤1 and being present in a thickness of between 3 and 100 micrometers,
  wherein the materials of the support substrate, the bonding layer and the first layer are refractory at a temperature of above 750° C., the active layer and second layer have a difference in lattice parameter of below 0.005 Å, the active layer is crack-free, and the heterostructure has a specific contact resistance between the bonding layer and the first layer that is equal to or below 0.1 ohm·cm², and wherein the active layer presents a main portion having a thickness representing between 70% and 100% of that of the active layer and which thickness of the main portion has dopants at a concentration that is equal to or below $10^{17}$ cm$^{-3}$, and wherein the support substrate material has a coefficient of thermal expansion of between a minimum coefficient and a maximum coefficient, wherein the minimum coefficient is no more than $0.5 \times 10^{-6}$ K$^{-1}$ lower than that of the coefficient of thermal expansion of the material of the main portion of the active layer and the maximum coefficient is more than $0.6 \times 10^{-6}$ K$^{-1}$ above the coefficient of thermal expansion of the material of the main portion of the active layer at temperatures where the active layer is formed by epitaxy.

2. The heterostructure according to claim 1, wherein the active layer presents a dislocation density that is lower than $10^8$ cm$^{-2}$ and the main portion of the active layer is located between subjacent and superjacent layers of the active layer, each of the subjacent and superjacent layers comprising dopants of a different type at a concentration of more than $10^{17}$ cm$^{-3}$.

3. The heterostructure according to claim 2, wherein the material of one of the main, subjacent and superjacent portions is GaN that is optionally doped with silicon.

4. The heterostructure according to claim 2, each of the main, subjacent and superjacent portions is constituted of a material $Al_xIn_yGa_{(1-x-y)}N$ with each portion having a different x or y composition.

5. The heterostructure according to claim 2, wherein the material of the main portion is of silicon doped n-type GaN.

6. The heterostructure according to claim 2, wherein the main portion of the active layer and the first seed layer are constituted of the same material.

7. The heterostructure according to claim 1, wherein the material of the support substrate is a metal chosen from the group consisting of tungsten, molybdenum, niobium, tantalum and their binary, ternary or quaternary alloys, including TaW, MoW, MoTa, MoNb, WNb or TaNb.

8. The heterostructure according to claim 7, wherein the support substrate is TaW comprising at least 45% tungsten or MoTa comprising more than 65% molybdenum.

9. The heterostructure according to claim 1, wherein the material of the bonding layer comprises polycrystalline silicon, tungsten or molybdenum silicide, tungsten, molybdenum, zinc oxide, a metal boride or indium tin oxide and the first layer is doped with a concentration of between $10^{17}$ and $10^{20}$ cm$^{-3}$ of n-type dopants.

10. The heterostructure according to claim 1, wherein the bonding layer comprises a material presenting an electrical resistivity that is lower than or equal to $10^{-4}$ ohm·cm, and the first layer has an electrical resistivity of between $10^{-3}$ and 0.1 ohm·cm.

11. The heterostructure according to claim 1, wherein the support substrate comprises molybdenum, the bonding layer comprises tungsten, the first layer comprises GaN and the active layer comprises GaN.

12. An electronic power, optoelectronic or photovoltaic component formed in or on the active layer of a heterostructure according to claim 1, comprising at least one electrical contact on the active layer and at least one electrical contact on the support substrate.

13. A method of manufacturing the heterostructure of claim 1 for the manufacture of electronic power components, optoelectronic components or photovoltaic components, with the heterostructure comprising an active layer of a monocrystalline material of composition $Al_xIn_yGa_{(1-x-y)}N$, where $0 \leq x \leq 1$, $0 \leq y \leq 1$ and $x+y \leq 1$, which method comprises:

providing a support substrate presenting an electrical resistivity below $10^{-3}$ ohm·cm and a thermal conductivity that is above 100 W·m$^{-1}$·K$^{-1}$, providing a donor substrate comprising the first and second layers of monocrystalline material adapted for epitaxial growth of the active layer, providing a bonding layer on one of the donor substrate or the support substrate, choosing the materials of the support substrate, the first and second layers and the bonding layer to be refractory at a temperature of above 750° C., such that the heterostructure has a specific contact resistance between the bonding layer and the first layer that is equal to or below 0.1 ohm·cm², choosing the support substrate material to have a coefficient of thermal expansion of between a minimum coefficient and a maximum coefficient, wherein the minimum coefficient is no more than $0.5 \times 10^{-6}$ K$^{-1}$ lower than that of the coefficient of thermal expansion of the material of the main portion of the active layer and the maximum coefficient is more than $0.6 \times 10^{-6}$ K$^{-1}$ above the coefficient of thermal expansion of the material of the main portion of the active layer at temperatures where the active layer is to be formed by epitaxy, choosing the material of the second layer to present a lattice parameter difference with the material of the active layer that is below 0.005 Å, bonding together by molecular adhesion the donor and support substrates with the bonding layer situated at the interface therebetween, thinning the donor substrate to expose the second layer upon the support substrate, and growing by epitaxy the active layer on the second layer to a thickness of between 3 and 100 micrometers without causing cracking of the active layer to form the heterostructure.

14. The method according to claim 13, which further comprises doping the active layer during or after epitaxial growth by implantation or diffusion of dopant species, doping the seed layer by implantation or diffusion of dopant species, or doping both layers.

15. The method according to claim 13, wherein the material of the support substrate is a metal chosen from the group consisting of tungsten, molybdenum, niobium, tantalum and their binary, ternary or quaternary alloys, including TaW, MoW, MoTa, MoNb, WNb or TaNb.

16. The method according to claim 13, which further comprises forming the first layer in the donor substrate by ionic implantation so as to create in the donor substrate an embrittlement zone at a depth that is substantially equal to the thickness of the first layer.

17. The method according to claim 16, wherein the ionic implantation is carried out after providing the bonding layer on the donor substrate, with the implantation being carried out through the bonding layer.

18. The method according to claim 13, which further comprises providing a surface roughness on one of the donor substrate or support substrate that is less than 1 nm for a 5 micrometer×5 micrometer surface measured by AFM and presents a peak valley surface topology below 10 nm, with the bonding layer provided on the substrate that does not have the recited surface roughness.

19. The method according to claim 13, which further comprises when the support substrate has a roughness that is greater than or equal to 1 nm for a 5 micrometer×5 micrometer surface measured by AFM and that presents a peak valley surface topology of at least 10 nm, the bonding layer is deposited on the support substrate and is polished until a roughness below 1 nm and a peak valley surface topology below 10 nm is reached.

* * * * *